United States Patent
Zhu

(10) Patent No.: US 7,288,443 B2
(45) Date of Patent: Oct. 30, 2007

(54) STRUCTURES AND METHODS FOR MANUFACTURING P-TYPE MOSFET WITH GRADED EMBEDDED SILICON-GERMANIUM SOURCE-DRAIN AND/OR EXTENSION

(75) Inventor: Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 10/710,244

(22) Filed: Jun. 29, 2004

(65) Prior Publication Data

US 2005/0285192 A1    Dec. 29, 2005

(51) Int. Cl.
*H01L 21/00* (2006.01)
*H01L 31/072* (2006.01)

(52) U.S. Cl. .................. 438/149; 438/197; 438/198; 257/347; 257/348

(58) Field of Classification Search ............ None
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke et al. | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |

(Continued)

FOREIGN PATENT DOCUMENTS

JP    64-76755    3/1989

OTHER PUBLICATIONS

Kern Rim, et al., "Transconductance Enhancement in Deep Submicron Strained-Si p-MOSFETs". International Electron Devices Meeting, 26, 8, 1, IEEE, Sep. 1998.

(Continued)

*Primary Examiner*—Sue A. Purvis
*Assistant Examiner*—Fazli Erdem
(74) *Attorney, Agent, or Firm*—Joseph P. Abate

(57) ABSTRACT

P-type MOSFETs (PMOSFETs) are formed by encapsulating the gate with an insulator and depositing a germanium containing layer outside the sidewalls, then diffusing the germanium into the silicon-on-insulator layer or bulk silicon by annealing or by oxidizing to form graded embedded silicon-germanium source-drain and/or Extension (geSiGe-SDE). For SOI devices, the geSiGe-SDE is allowed to reach the buried insulator to maximize the stress in the channel of SOI devices, which is beneficial for ultra-thin SOI devices. Graded germanium profiles provide a method to optimize stress in order to enhance device performance. The geSiGe-SDE creates a compressive stress in the horizontal direction (parallel to the gate dielectric surface) and tensile stress in the vertical direction (normal to the gate dielectric surface) in the channel of the PMOSFET, therebyforming a structure that enhances PMOSFET performance.

15 Claims, 4 Drawing Sheets

U.S. PATENT DOCUMENTS

| | | | |
|---|---|---|---|
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,716 A | 8/1999 | Jin et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,621,392 B1 | 9/2003 | Volant et al. |
| 6,635,506 B2 | 10/2003 | Volant et al. |
| 6,717,216 B1 | 4/2004 | Doris et al. |
| 6,825,529 B2 | 11/2004 | Chidambarrao et al. |
| 6,831,292 B2 | 12/2004 | Currie et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0009784 A1 | 7/2001 | Ma et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0181005 A1* | 9/2003 | Hachimine et al. ......... 438/231 |
| 2004/0113174 A1 | 6/2004 | Chidambarrao et al. |
| 2004/0113217 A1 | 6/2004 | Chidambarrao et al. |
| 2004/0195623 A1* | 10/2004 | Ge et al. ................... 257/347 |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

OTHER PUBLICATIONS

Kern Rim, et al., "Characteristics and Device Design of Sub-100 nm Strained Si N- and PMOSFETs." 2002 Symposium on VLSI Technology Digest of Technical Papers, IEEE, PP. 98-99.

Gregory Scott, et al., "NMOS Drive Current Reduction Caused by Transistor Layout and Trench Isolation Induced Stess." International Electron Devices Meeting, 34.4.1, IEEE, Sep. 1999.

F. Ootsuka, et al., "A Highly Dense, High-Performance 130nm Node CMOS Technology for Large Scale System-on-a-Chip Application." International Electron Devices Meeting, 23.5.1, IEEE, Apr. 2000.

Shinya Ito, et al., "Mechanical Stress Effect of Etch-Stop Nitride and its Impact on Deep Submicron Transistor Design." International Electron Devices Meeting, 10.7.1, IEEE, Apr. 2000.

A. Shimizu, et al., "Local Mechanical-Stress Control (LMC): A New Technique for CMOS-Performance Enhancement." International Electron Devices Meeting, IEEE, Mar. 2001.

K. Ota, et al., "Novel Locally Strained Channel Technique for High Performance 55nm CMOS." International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-2156.

H.S. Momose, et al., "Temperature Dependence of Emitter-Base Reverse Stress Degradation and its Mechanism Analyzed by MOS Structures." Paper 6.2, pp. 140-143.

C.J. Huang, et al., "Temperature Dependence and Post-Stress Recovery of Hot Electron Degradation Effects in Bipolar Transistors." IEEE 1991 Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003 IEEE GaAs Digest, pp. 263-266.

H. Wurzer, et al., "Annealing of Degraded npn-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fuax/Pt = 350/300 GHz and Gate Delay Below 3.3 ps". 2004 IEEE, 4 pages.

J.C. Bean, et al., "GEx SI 1-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al., "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI 1-x GEx Strained Layers on (100) Si". Appl. Phys. Lett 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000 IEEE, pp. 151-154.

\* cited by examiner

STRUCTURES AND METHODS FOR MANUFACTURING P-TYPE MOSFET WITH GRADED EMBEDDED SILICON-GERMANIUM SOURCE-DRAIN AND/OR EXTENSION

BACKGROUND OF INVENTION

The present invention relates generally to the field of semiconductor manufacturing and of integrated circuit fabrication. More particularly, the present invention relates to complementary metal oxide semiconductor (CMOS) field effect transistors (FET) with strained silicon for high performance and a method for manufacturing the same.

Since it has become increasingly difficult to improve metal-oxide-semiconductor-field-effect transistor (MOSFET) performance through continued scaling, methods enhancing performance of MOSFETs without scaling have become important. Strained silicon (Si) has shown enhancement of mobility for both electrons and holes. Therefore, in contemporary CMOS technology, there is significant interest and work in the use of strained material for the FET channel.

In one approach, silicon-germanium alloy (SiGe) is used to form a surface channel strained Si/relaxed SiGe n-type MOSFET (NMOSFET or NFET). In that approach, biaxial tensile strain is induced in a very thin epitaxial Si layer. The tensile strain reduces the effective mass of the electrons, which results in enhancement of electron mobility.

In the case of a p-type MOSFET (PMOSFET or PFET), the germanium (Ge) concentration must be greater than about 30% in order to have an effective increase in hole mobility.

This approach has the following drawbacks: 1) The strained silicon is grown on relaxed SiGe, and therefore it is difficult to control the leakage of devices.

2. The requirement for enhanced performance of more than 30% germanium concentration further increases the defect density.

3. The high diffusivity of dopant, such as arsenic and phosphorus, in SiGe makes it difficult to form shallow p-n junctions. For sub-micron or deep-sub-micron MOSFETs, shallow junctions are required to scale devices.

Thus, the art has a need for a method of making circuits having the benefits of strained silicon without the low yield characteristic of the prior art.

SUMMARY OF INVENTION

The invention relates to a method of forming a PMOSFET having compressive stress on the channel of PMOSFETs, thereby improving hole mobility.

A feature of the invention is the introduction of compressive stress in selected areas of an integrated circuit by introduction of germanium into the silicon lattice in the areas that will become the source and drain.

A feature of the invention is the use of a PMOSFET with graded germanium doped source/drain and/or extension for strain development provided by an epitaxial layer of SiGe. Since graded germanium profile does not have a sharp interface (where the dislocations are generated) between SiGe and Si, dislocations are not easily produced. This can reduce leakage of devices caused by dislocations. Graded germanium profiles also provide a method to optimize stress in order to enhance device performance.

Another feature of the invention is full or partial vertical penetration by germanium of the SOI layer to form areas of SiGe within the SOI layer.

Another feature of the invention is a choice between diffusion driven by an anneal and/or diffusion driven by an oxidation process.

DETAILED DESCRIPTION

Figure 1:
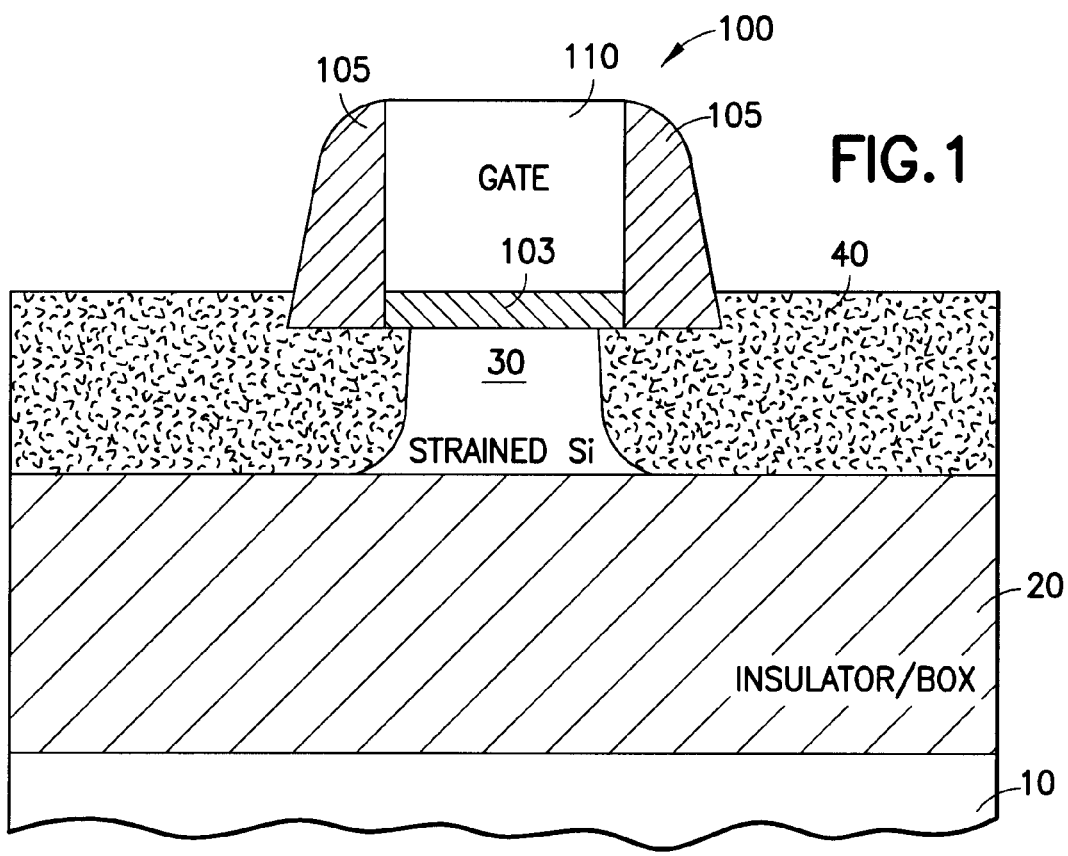
FIG. 1 illustrates a structure formed with one version of the invention. A SOI PMOSFET structure in which the graded SiGe source/drain (SD) reaches to the buried insulator.

FIG. 1 shows in cross section a simplified field effect transistor 100 formed in a portion of a silicon wafer 10 having a buried insulator layer 20 and a device layer of silicon or semiconductor (or an SOI layer) 30. Transistor gate 110 and sidewalls 105 are positioned above gate oxide 103 that defines the lateral extent of body 30. Source and drain 40 are formed from portions of the SOI layer 30 that have been doped with germanium in a previous step. The germanium has diffused downward toward the insulator layer 30 and inward to the center of the channel under the gate. This has imposed compressive stress in the horizontal direction (parallel to the SOI surface) in the SOI and tensile stress in vertical direction (normal to the SOI surface) in the center of the device. These components complete a field effect transistor that illustratively has an n-type body that forms a channel for p-type field effect transistor (PMOSFET).

A PFET is shown for illustration. Typically, in current technology, the circuit will use CMOS technology, including both NMOSFETs and PMOSFETs.

The wafer is illustratively a commercially available wafer produced by the SIMOX (Separation by Implantation of Oxygen) process. Other methods of producing wafers may also be used.

Referring back to FIG. 1, the source and drain 40 on either side of the gate have a gradation of germanium having a maximum value at the top and reducing in magnitude toward the BOX (buried oxide) layer 20. This is caused by the diffusion of germanium into the silicon SOI layer from an upper layer of SiGe or germanium. Implantation of germanium is a possible alternative, but for most applications is unsatisfactory because it would take too long to deliver the required dose. In addition, implantation of a typical dose of germanium would cause extensive crystal damage that would be difficult to remove.

An advantage of the use of an epitaxial step for the deposition of the SiGe layer is that the epitaxial deposition is selective and deposits the SiGe only on exposed silicon. This reduces the amount of cleanup that would be required otherwise for the case of depositing SiGe or Ge everywhere over the device (e.g. gate, spacer, and SD).

The diffusion process may be carried out long enough to spread the germanium concentration fairly evenly or it may be limited in time so that there is a significant concentration gradient from top to bottom of the SOI layer.

The presence of the germanium in the silicon lattice creates a compressive stress in the source and drain extending from left to right in the Figures. This stress, in turn, produces a compressive stress in the horizontal direction (parallel to the SOI surface) in the SOI and tensile stress in the vertical direction (normal to the SOI surface) in the channel of the device 100.

Both compressive stress in horizontal direction in the SOI and tensile stress in the vertical direction in the channel of the device produces increased hole mobility that increases PMOSFET performance.

Preferably, the germanium concentration is graded from top to bottom i.e. the diffusion is limited in time so that the germanium does not spread uniformly throughout layer 30, especially does not spread into the channel area of the device. The concentration has a maximum value at the top and declines to a dopant depth that is less than the thickness of the SOI layer. This gradation produces fewer dislocations in the crystal structure than a sharp profile would.

Figure 4:
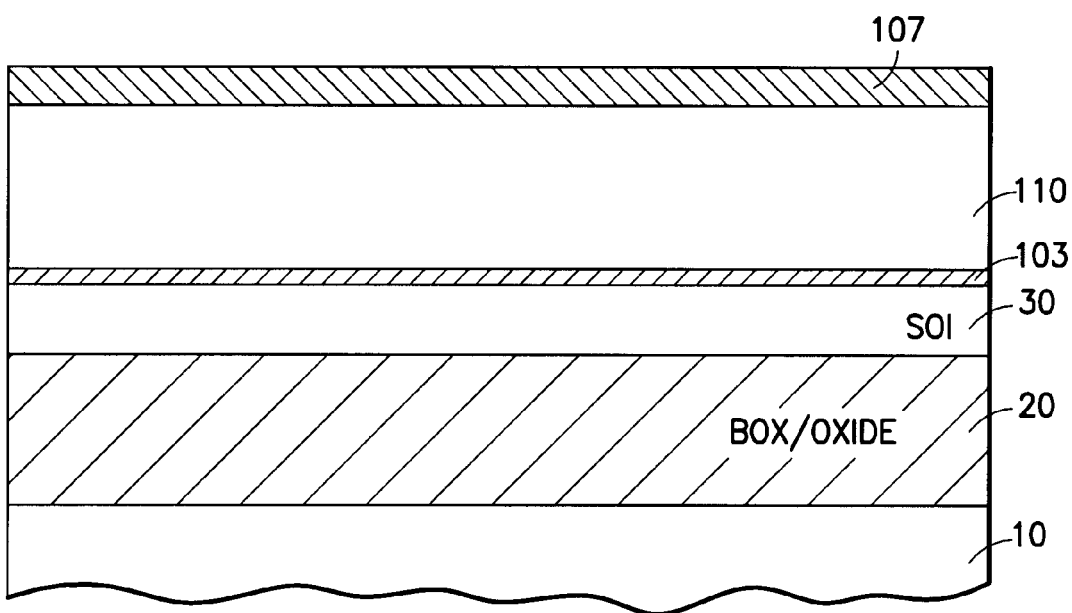
FIG. 4 illustrates an initial step in the formation of the structure of FIG. 1.

Referring now to FIG. 4, the starting material for the practice of the invention is illustrated, in which substrate 10 supports BOX 20 having SOI layer 30 positioned above it.

In contemporary technology, the thickness of layer 30 may be in the range of 5 100 nm. Such thin layers are difficult to process with conventional methods, and it is a beneficial aspect of the invention that thin SOI layers are not a problem.

For a PMOSFET, boron is usually used to dope the SD area and arsenic to dope the channel area. Boron diffusion is slower in SiGe than in Si. Arsenic diffusion is slower in Si than in SiGe. The resulting structure can help to form shallow SD and an extension p-n junction and a sharp halo profile of the PMOSFET.

In FIG. 4, a gate oxide layer 103, nominally 0.5 2 nm thick has been grown on the surface of layer 30. An alternative gate insulator layer, such as nitride, oxy-nitride or high-K materials might also be used.

A gate layer of polycrystalline silicon (poly) 110 has been deposited on oxide layer 30, with a hardmask layer of nitride 107 on the top.

Figure 5:
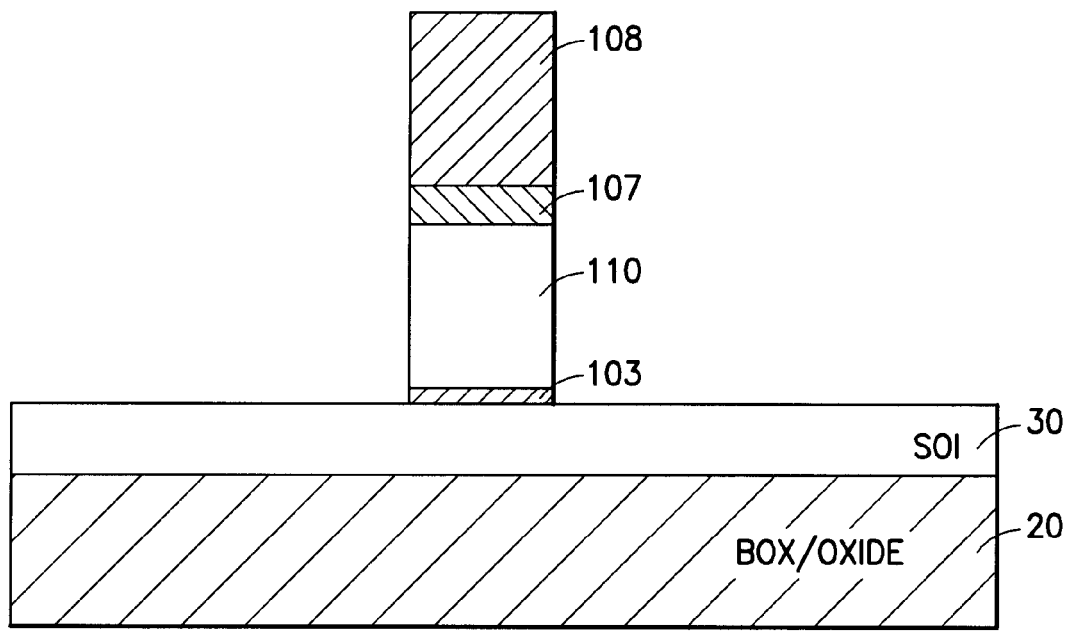
FIG. 5 illustrates patterning the gate stack.

FIG. 5 shows the result of depositing, exposing and curing a layer of photoresist 108, then etching a gate stack to be used in the FET to be formed. Illustratively, a reactive ion etch (RIE) is used because of its directional properties. Conventional etch materials are used as required to etch the various materials cleanly, stopping on the top surface of SOI layer 30.

Figure 6:
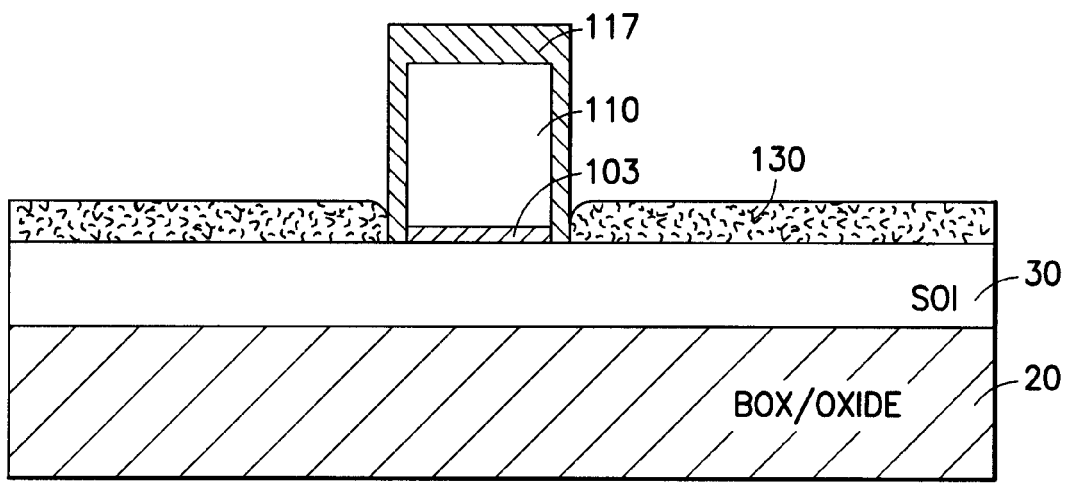
FIG. 6 illustrates forming the epitaxial dopant layer.

FIG. 6 shows the result of forming a thin conformal layer of nitride, illustratively about 10 nm thick, then etching the horizontal portions of the nitride to leave an encapsulating layer 117 that protects the sides of the gate stack during subsequent processing and also defines a displacement distance between the transistor body below gate oxide 103 and the germanium diffusion that will follow. The portion of layer 117 on the top of gate 110 is the remainder of layer 107 after the step of etching the horizontal nitride surface.

A selective epitaxial growth process has also been performed, growing the epitaxial material 130 on exposed silicon surfaces.

Epitaxial layer 130 has a germanium concentration that is preferably greater than about 30% and a thickness such that sufficient germanium is available to diffuse into the SOI layer 30. Illustratively, the thickness of epitaxial layer 130 is about 15-30 nm.

Figure 7:
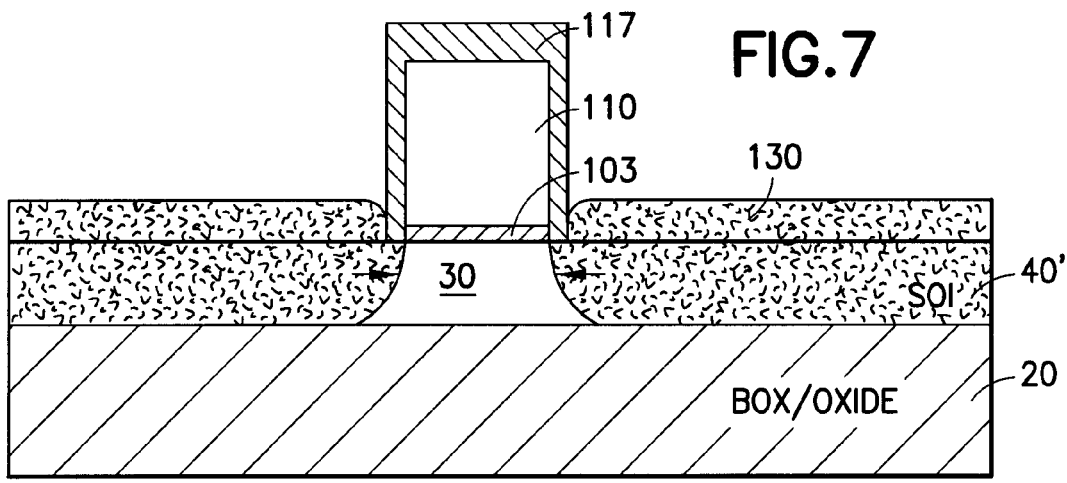
FIG. 7 illustrates the structure after diffusing the germanium into the silicon SOI layer.

FIG. 7 shows the result of performing an anneal step at 1000 C for 10 minutes, which produces the desired diffusion of Germanium from dopant layer 130 into the SOI layer 30, with a maximum germanium concentration value at the top of layer 30, decreasing to a lower value at the bottom. The temperature and time of the anneal will be selected to produce the desired germanium gradient; in this case, having a significant germanium concentration all the way to the bottom surface of layer 30, forming SD 40.

The addition of germanium to the crystal structure of the silicon SOI layer will impose a compressive strain on the material in the source and drain 40 in FIG. 1. That compressive strain will, in turn, exert compressive stress in the horizontal direction in the SOI and tensile stress in the vertical direction in the channel of the device 100.

Conventional later steps in the process, well known in the art, such as performing a halo implant, an extension implant, spacer formation, S/D implantation and metallization are referred to for purposes of the claims as "completing the transistor". This approach can be combined with a disposable spacer method to manufacture a high performance MOSFET. That is removing the nitride spacer, reoxidation of the poly gate as needed, halo and extension ion implantation, spacer formation, followed by SD ion implantation and SD anneal.

In summary, the process is: Start with a silicon SOI wafer; grow gate oxide (or equivalent); deposit poly gate layer (or deposit metal for metal gate device); deposit nitride mask layer; Deposit and pattern photoresist, RIE nitride, poly-Si (RIE metal for metal gate) and oxide; form thin nitride spacer (~10-30 nm); selective epitaxial SiGe (or germanium) on exposed silicon; high temperature anneal, diffusing germanium into Si device layer, grading germanium concentration vertically and horizontally, but preferably the germanium profiles do not enter the channel area; complete transistor including halo implant, extension implant, spacer formation, S/D implant, RTA, metallization.

Figure 8:
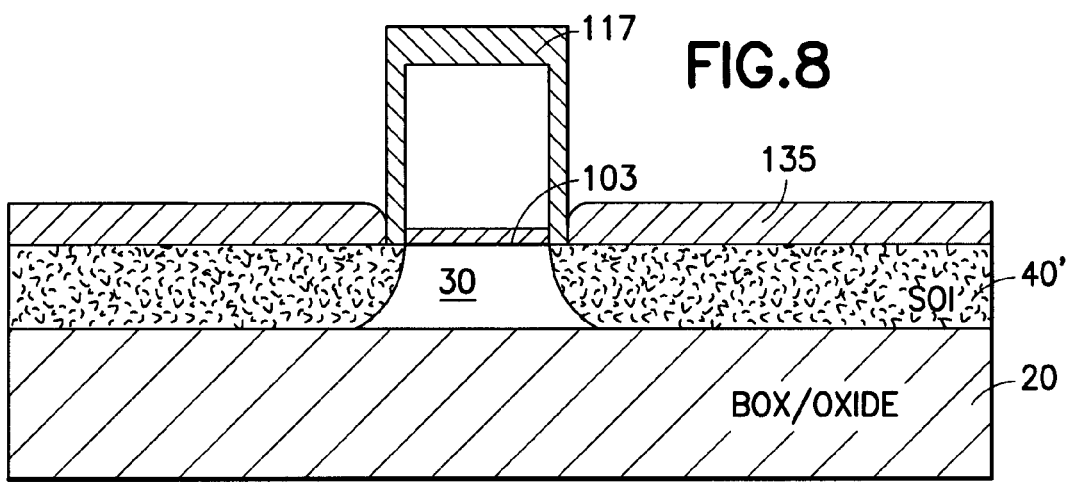
FIG. 8 illustrates a structure that is an alternative to the structure of FIG. 7.

FIG. 8 shows a step in a second version of the invention in which the steps up to and including FIG. 6 are the same. The resulting structure produced by this alternative method is the same as that in FIG. 1. FIG. 8 shows the growth of an oxide layer 135 on the top surface of SiGe layer 130. In this example, the oxide has consumed the entire SiGe layer, turning it into oxide 135. Due to the snowplow effect of the oxidation in SiGe, Ge atoms in SiGe are driven into SOI layer. The oxidation approach is more efficient to drive in Ge into Si than annealing only. However, an oxidation method may produce defects that cause leakage of devices. Also it may be not easy to control the oxidation process at corners of the SiGe.

During the course of the thermal oxidation, the heat required has driven Germanium into SOI layer 30, in this case, extending all the way down to BOX layer 20 and forming graded SiGe SD 40.

Figure 9:
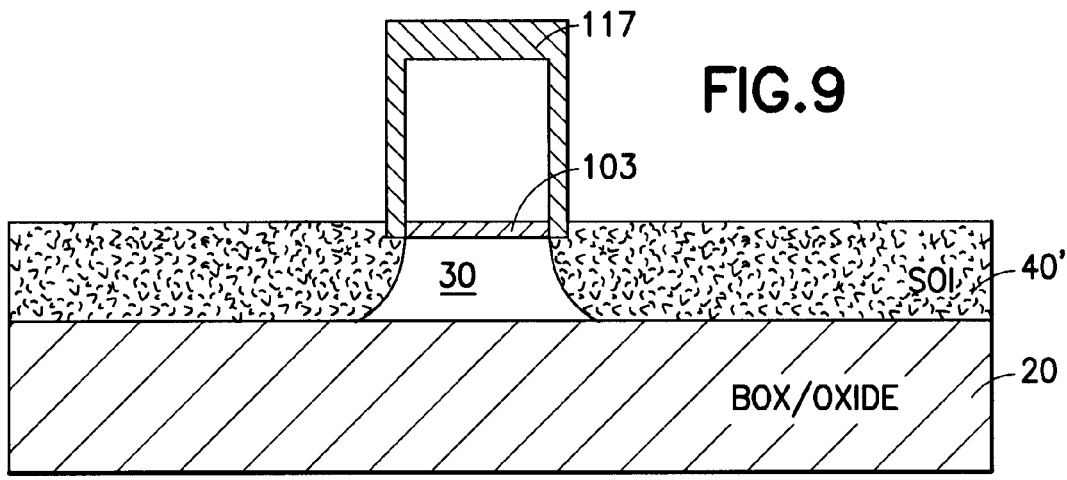
FIG. 9 illustrates a following step to the step of FIG. 8.

FIG. 9 illustrates the result of stripping oxide 135 in a wet etch, leaving a clean surface for subsequent processing.

The structure of FIG. 9 may also be completed with the same conventional completion steps as discussed above in connection with FIG. 7.

Figure 2:
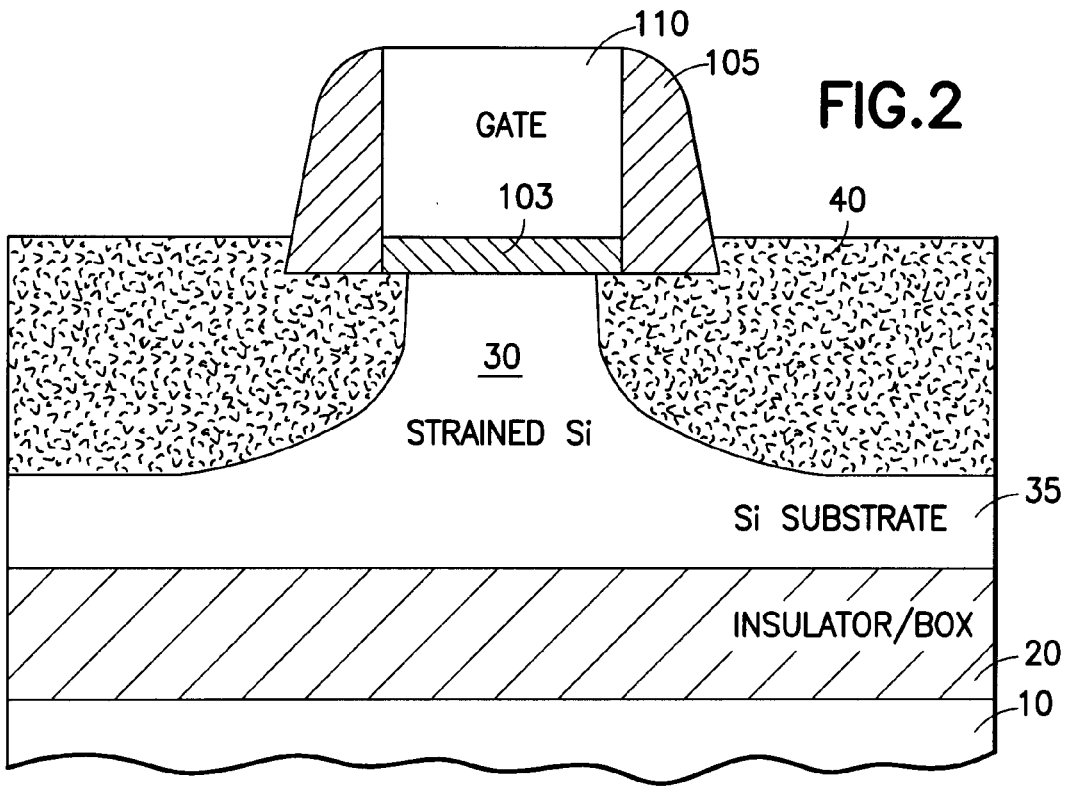
FIG. 2 illustrates a structure formed with a second version of the invention. A SOI PMOSFET structure in which the graded SiGe SD does not reach to the buried insulator.

FIG. 2 shows an alternative version of the invention, in which the Source and Drain 40 extend only partially through the SOI layer, leaving a portion of SOI layer 30 as lower silicon 35. The gate structure is the same in FIGS. 1 and 2.

The structure of FIG. 2 has the advantage that the Germanium is concentrated at the top of SOI layer 30, so that the stress is concentrated there also. For a surface channel transistor, the presence of strain lower down in the SOI layer is not of any substantial benefit, while the diffusion to a shallower depth will take a shorter time.

The structure shown in FIG. 1 is particularly important for ultra-thin SOI devices since it is very difficult to controllably etch SD area down without reaching the BOX. However, it is required (by the conventional method of embedded SiGe SD) to have Si left in the SD area in order to epitaxially grow SiGe in the SD area. Undesirable misfit dislocations can be generated when the thickness of strained SiGe exceeds the critical thickness for a given Ge fraction. This restricts the use of high Ge fractions in strained SiGe with large thickness. One can vary the structures between FIG. 1 and FIG. 2 to optimize the stress in the channel. For example, a high Ge fraction with a thin graded SiGe SD or a low Ge fraction with a thick graded SiGe SD.

Either of the two methods discussed above may be used to generate this structure, in which the diffusion of germanium into the SOI layer is controlled to stop before the entire layer has been filled with Germanium.

In forming a structure as shown in FIG. 2, it is necessary to limit the exposure to heat, in order to limit the vertical extent of germanium diffusion.

Figure 3:
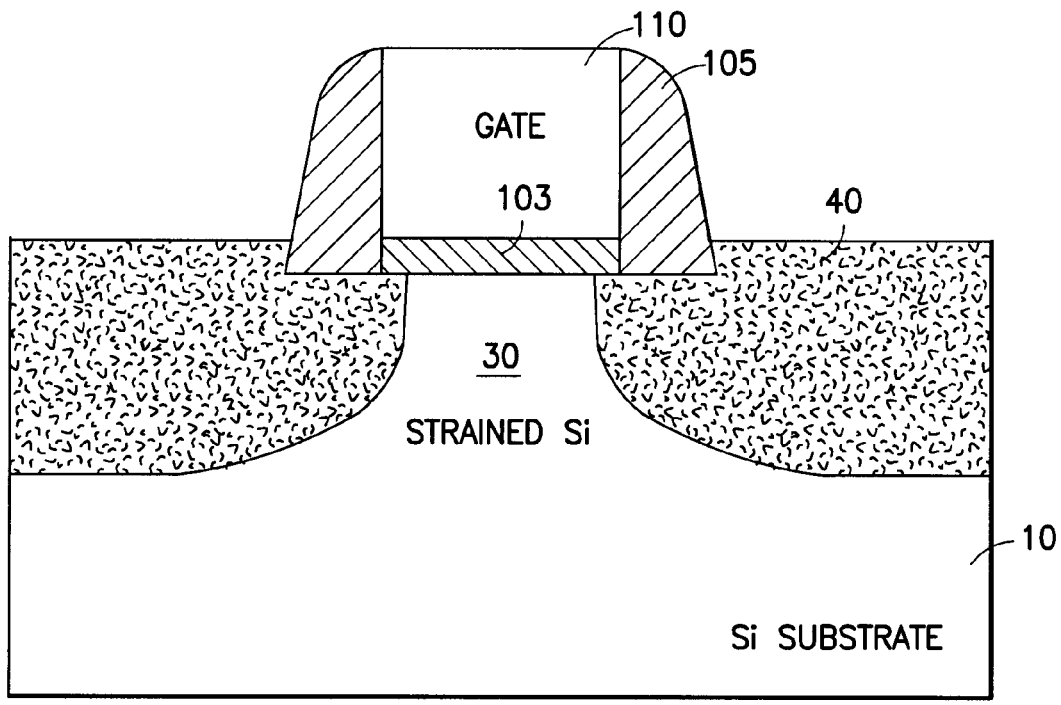
FIG. 3 illustrates a structure formed with a third version of the invention. A bulk PMOSFET structure with graded SiGe SD.

FIG. 3 shows another alternative version of the invention, in which the wafer is a bulk silicon wafer, so that the Source and Drain 40 extend only partially into the bulk silicon, leaving a portion of lower silicon 10. Another way to form the FIG. 3 structure is that of etching down Si in SD area followed by selective epi SiGe (as proposed by prior art). An anneal then forms graded SiGe in the SD area. This method has advantage of producing stronger stress in the channel with the epi interface away from the channel. Therefore, this can reduce the leakage caused by the defects at an epi interface.

The advantages and disadvantages of bulk versus SOI wafers are well known in the art and need not be repeated here. The designer of the integrated circuit will have to make a trade off in order to select bulk or SOI wafers.

This version of the invention may also make use of the annealing or the oxidation method of diffusion.

While the invention has been described in terms of a single preferred embodiment, those skilled in the art will recognize that the invention can be practiced in various versions within the spirit and scope of the following claims.

The invention claimed is:

1. A method of forming a PMOSFET, comprising the steps of:
providing an SOI wafer having a buried insulator layer and a SOI layer above said buried insulator layer;
forming a layer of gate insulator over said SOI layer;
forming a transistor gate over said SOI layer having a channel underneath said gate;
forming insulator sidewalls on first and second sides of said gate;
epitaxially forming a doped layer containing a dopant on said SOI layer and adjacent to said insulator sidewalls;
diffusing said dopant into said SOI layer from said doped layer, thereby producing compressive stress in the horizontal direction parallel to an SOI surface and tensile stress in a vertical direction normal to said SOI surface in said channel;
in which said step of diffusing continues until germanium reaches a bottom surface of said SOI layer; and
completing said PMOSFET.

2. A method according to claim 1, in which said step of diffusing is effected by a high temperature anneal.

3. A method of forming a PMOSFET, comprising the steps of:
providing an SOI wafer having a buried insulator layer and a SOI layer above said buried insulator layer;
forming a layer of gate insulator over said SOI layer;
forming a transistor gate over said SOI layer having a channel underneath said gate;
forming insulator sidewalls on first and second sides of said gate;
epitaxially forming a doped layer containing a dopant on said SOI layer and adjacent to said insulator sidewalls;
diffusing said dopant into said SOI layer from said doped layer, thereby producing compressive stress in the horizontal direction parallel to an SOI surface and tensile stress in a vertical direction normal to said SOI surface in said channel;
in which said step of diffusing stops before germanium reaches a bottom surface of said SOI layer; and
completing said PMOSFET.

4. A method of forming a PMOSFET, comprising the steps of:
providing an SOI wafer having a buried insulator layer and a SOI layer above said buried insulator layer;
forming a layer of gate insulator over said SOI layer;
forming a transistor gate over said SOI layer having a channel underneath said gate;
forming insulator sidewalls on first and second sides of said gate;
epitaxially forming a doped layer containing a dopant on said SOI layer and adjacent to said insulator sidewalls;
diffusing said dopant into said SOI layer from said doped layer, thereby producing compressive stress in the horizontal direction parallel to an SOI surface and tensile stress in a vertical direction normal to said SOI surface in said channel;
in which said doped layer is SiGe having a germanium concentration of greater than atomic number 20%; and
completing said PMOSFET.

5. A method of forming a PMOSFET, comprising the steps of:
providing an SOI wafer having a buried insulator layer and a SOI layer above said buried insulator layer;
forming a layer of gate insulator over said SOI layer;
forming a transistor gate over said SOI layer having a channel underneath said gate;
forming insulator sidewalls on first and second sides of said gate;
epitaxially forming a doped layer containing a dopant on said SOI layer and adjacent to said insulator sidewalls;
diffusing said dopant into said SOI layer from said doped layer, thereby producing compressive stress in the horizontal direction parallel to an SOI surface and tensile stress in a vertical direction normal to said SOI surface in said channel;
further comprising growing a layer of thermal oxide on said doped layer, thereby diffusing said dopant in the doped layer into said SOI layer; and
completing said PMOSFET.

6. A method according to claim 5, further comprising a step of removing said thermal oxide after said step of diffusing said dopant.

7. A method according to claim 5, in which said step of diffusing continues until said germanium reaches a bottom surface of said SOI layer.

8. A method according to claim 5, in which said step of diffusing stops before said dopant reaches a bottom surface of said SOI layer.

9. A method according to claim 5, in which said doped layer is SiGe.

10. A method according to claim 9, in which said doped layer is SiGe with a germanium concentration of greater than atomic number 20%.

11. A method of forming a PMOSFET, comprising the steps of:
providing a bulk silicon wafer;
forming a layer of gate insulator over said bulk silicon;
forming a transistor gate over said bulk silicon having a channel underneath said gate;
forming insulator sidewalls on first and second sides of said gate;
epitaxially forming a doped layer containing germanium or impurity on said bulk silicon and adjacent to said insulator sidewalls;
diffusing germanium into said bulk silicon from said germanium doped layer, thereby producing compressive stress in horizontal direction (parallel to SOI surface) and tensile stress in vertical direction (in normal of SOI surface) in said channel; in which said dopant layer is SiGe with a germanium concentration of greater than atomic number 20%; and
completing said PMOSFET.

12. A method of forming a PMOSFET, comprising the steps of:
providing a bulk silicon wafer;
forming a layer of gate insulator over said bulk silicon;
forming a transistor gate over said bulk silicon having a channel underneath said gate;
forming insulator sidewalls on first and second sides of said gate;
epitaxially forming a doped layer containing germanium or impurity on said bulk silicon and adjacent to said insulator sidewalls;
diffusing germanium into said bulk silicon from said germanium doped layer, thereby producing compressive stress in horizontal direction (parallel to SOI surface) and tensile stress in vertical direction (in normal of SOI surface) in said channel; further comprising growing a layer of thermal oxide on said dopant layer, thereby diffusing said dopant into said bulk silicon; and
completing said PMOSFET.

13. A method according to claim 12, further comprising a step of removing said thermal oxide after said step of diffusing said dopant.

14. A method according to claim 12, in which said dopant layer is SiGe.

15. A method according to claim 14, in which said dopant layer is SiGe with a germanium concentration of greater than atomic number 20%.

* * * * *